(12) United States Patent
Toda et al.

(10) Patent No.: US 10,433,420 B2
(45) Date of Patent: Oct. 1, 2019

(54) CIRCUIT BOARD DEVICE AND PRINTED WIRING BOARD

(71) Applicant: LAPIS Semiconductor Co., Ltd., Yokohama (JP)

(72) Inventors: Kentaro Toda, Yokohama (JP); Kenji Arai, Yokohama (JP); Manabu Miyazawa, Yokohama (JP); Kenichiro Nagatomo, Yokohama (JP); Toru Ueno, Yokohama (JP); Tsuguto Maruko, Yokohama (JP); Hirofumi Ogawa, Yokohama (JP); Tetsuo Oomori, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/279,176

(22) Filed: Feb. 19, 2019

(65) Prior Publication Data

US 2019/0261507 A1 Aug. 22, 2019

(30) Foreign Application Priority Data

Feb. 20, 2018 (JP) .................................. 2018-27561

(51) Int. Cl.
*H05K 1/02* (2006.01)
*H01L 23/522* (2006.01)
*G06F 1/26* (2006.01)

(52) U.S. Cl.
CPC ............. *H05K 1/0298* (2013.01); *G06F 1/26* (2013.01); *H01L 23/5226* (2013.01)

(58) Field of Classification Search
CPC .. H05K 1/0215; H05K 1/0216; H05K 1/0219; H05K 1/0224; H05K 1/0225; H05K 1/0227

See application file for complete search history.

(56) References Cited

FOREIGN PATENT DOCUMENTS

JP 2001-203434 A 7/2001
JP 2009-27140 A 2/2009

*Primary Examiner* — Jeremy C Norris
(74) *Attorney, Agent, or Firm* — Rabin & Berdo, P.C.

(57) ABSTRACT

A circuit board device includes: a printed wiring board; an IC chip provided on an obverse surface of the board and having at least one ground terminal; and a wiring pattern, disposed on the board, for providing a ground potential to the ground terminal of the IC chip. The wiring pattern is disposed on a reverse surface of the printed wiring board. The circuit board device has at least one via that is connected to the wiring pattern and passes through the printed wiring board at a position within a region where the IC chip is mounted on the obverse surface of the printed wiring board.

18 Claims, 6 Drawing Sheets

CIRCUIT BOARD DEVICE AND PRINTED WIRING BOARD

BACKGROUND OF THE INVENTION

1. Field of the Invention

The present invention relates to a circuit board device and a printed wiring board.

2. Description of the Related Art

Circuit board devices equipped with semiconductor integrated circuits (referred to as IC chips) have been known in the art. Japanese Patent Application Laid-Open No. 2009-027140, for example, proposes a circuit board device designed to reduce electromagnetic interference (EMI) due to common mode noise generated from a power supply and a ground terminal of an IC chip. In such a circuit board device, a power supply terminal and the ground terminal of the IC chip are connected to a conductor pattern through capacitors. There is described that, the conductor pattern is connected to a plane conductor connected neither to a ground plane nor to a power supply plane through a filter, thereby such a configuration relatively reduces common mode noise flowing through the power supply and the ground of a printed wiring board to be an antenna in the Japanese Patent Application Laid-Open No. 2009-027140.

Japanese Patent Application Laid-Open No. 2001-203434 proposes a printed wiring board designed to suppress unwanted electromagnetic radiation generated from circuit patterns formed in a power supply layer and a ground layer. Such unwanted electromagnetic radiation is similar to the EMI in Japanese Patent Application Laid-Open No. 2009-027140. Japanese Patent Application Laid-Open No. 2001-203434 describes that unwanted electromagnetic radiation can be suppressed by connecting a bypass capacitor having a resonant frequency approximately the same as a resonant frequency f of the printed wiring board itself equipped with no electronic components such as IC chips between the power supply layer and the ground layer of the printed wiring board.

SUMMARY OF THE INVENTION

In the circuit board device described in Japanese Patent Application Laid-Open Publication No. 2009-027140, however, a loop of a power supplying line and a ground line, which may be subjected to electromagnetic induction externally, is present on a surface of the printed wiring board. Thus, if such a loop is subjected to the electromagnetic induction by external noise (such as electromagnetic waves or electromagnetic susceptibility (EMS), etc.), electromotive current is generated, thereby varying the power supply voltage of the IC chip. While various ways to reduce electromagnetic induction have been devised in the design of IC chips or large scale integration (LSI) chips mounted in electronic devices, sufficient noise tolerance has not been achieved in the conventional circuit board devices.

The present invention has been made in view of the above-described problem. It is an object of the present invention to provide a circuit board device that can reduce the entering of external noise.

According to one aspect of the present invention, a printed wiring board comprises:

a primary layer which has a first region on which an IC chip is mounted and a second region adjacent to the first region;

a first wiring which is provided across the first region and the second region of the primary layer of the printed wiring board;

a second wiring which is provided in the second region of the primary layer of the printed wiring board;

a first via which passes through the primary layer of the printed wiring board to be connected to the first wiring of the first region;

a second via which passes through the primary layer of the printed wiring board to be connected to the second wiring; and a ground layer which is provided on an opposite side of the first wiring and the second wiring with respect to the primary layer and is electrically connected to the first wiring and the second wiring through the first via and the second via.

According to another aspect of the present invention, a printed wiring board comprises:

a primary layer which has a first region on which an IC chip is mounted and a second region adjacent to the first region;

a first wiring which is provided 1in the second region of the primary layer of the printed wiring board;

a second wiring which is provided in the second region of the primary layer and is placed at a distance from the first wiring and is supplied with a power supply potential;

a third wiring which is provided in the second region of the primary layer and is placed at a distance from the first wiring and the second wiring;

a first via which passes through the primary layer to be connected to the first wiring;

a second via which passes through the primary layer of the printed wiring board to be connected to the second wiring and the third wiring; and a ground layer which is provided on an opposite side of the first wiring, the second wiring and the third wiring with respect to the primary layer and is electrically connected to the first wiring, the second wiring and the third wiring through the first via and the second via.

According to a further other aspect of the present invention, a circuit board device comprises:

a printed wiring board including a primary layer which has a first region on which an IC chip is mounted and a second region adjacent to the first region;

a first wiring which is provided across the first region and the second region of the primary layer of the printed wiring board;

a second wiring which is provided in the second region of the primary layer of the printed wiring board;

a first via which passes through the primary layer of the printed wiring board to be connected to the first wiring of the first region;

a second via which passes through the primary layer of the printed wiring board to be connected to the second wiring; and a ground layer which is provided on an opposite side of the first wiring and the second wiring with respect to the primary layer and is electrically connected to the first wiring and the second wiring through the first via and the second via; and an IC chip which is mounted on the first region of the printed wiring board and has a ground terminal connected to the first wiring and a power supply terminal connected to the second wiring.

According to a still further aspect of the present invention, a circuit board device comprises:

a printed wiring board including
  a primary layer which has a first region on which an IC chip is mounted and a second region adjacent to the first region;
  a first wiring which is provided 1in the second region of the primary layer of the printed wiring board;
  a second wiring which is provided in the second region of the primary layer and is placed at a distance from the first wiring and is supplied with a power supply potential;
  a third wiring which is provided in the second region of the primary layer and is placed at a distance from the first wiring and the second wiring;
  a first via which passes through the primary layer to be connected to the first wiring;
  a second via which passes through the primary layer of the printed wiring board to be connected to the second wiring and the third wiring; and
  a ground layer which is provided on an opposite side of the first wiring, the second wiring and the third wiring with respect to the primary layer and is electrically connected to the first wiring, the second wiring and the third wiring through the first via and the second via; and
an IC chip which is mounted on the first region of the printed wiring board and has a ground terminal connected to the first wiring and a power supply terminal connected to the second wiring.

According to an additional aspect of the present invention, a circuit board device includes: a printed wiring board; an IC chip provided on an obverse surface of the printed wiring board and having at least one ground terminal and at least one power supply terminal; and a ground line and a power supplying line provided on the printed wiring board for providing a ground potential and a power supply potential to the ground terminal and the power supply terminal of the IC chip, respectively. The ground line is provided on a reverse surface of the printed wiring board. At least one via that is connected to the ground line and passes through the printed wiring board is present in a region where the IC chip is mounted on the obverse surface of the printed wiring board.

DETAILED DESCRIPTION OF THE INVENTION

Figure 1:
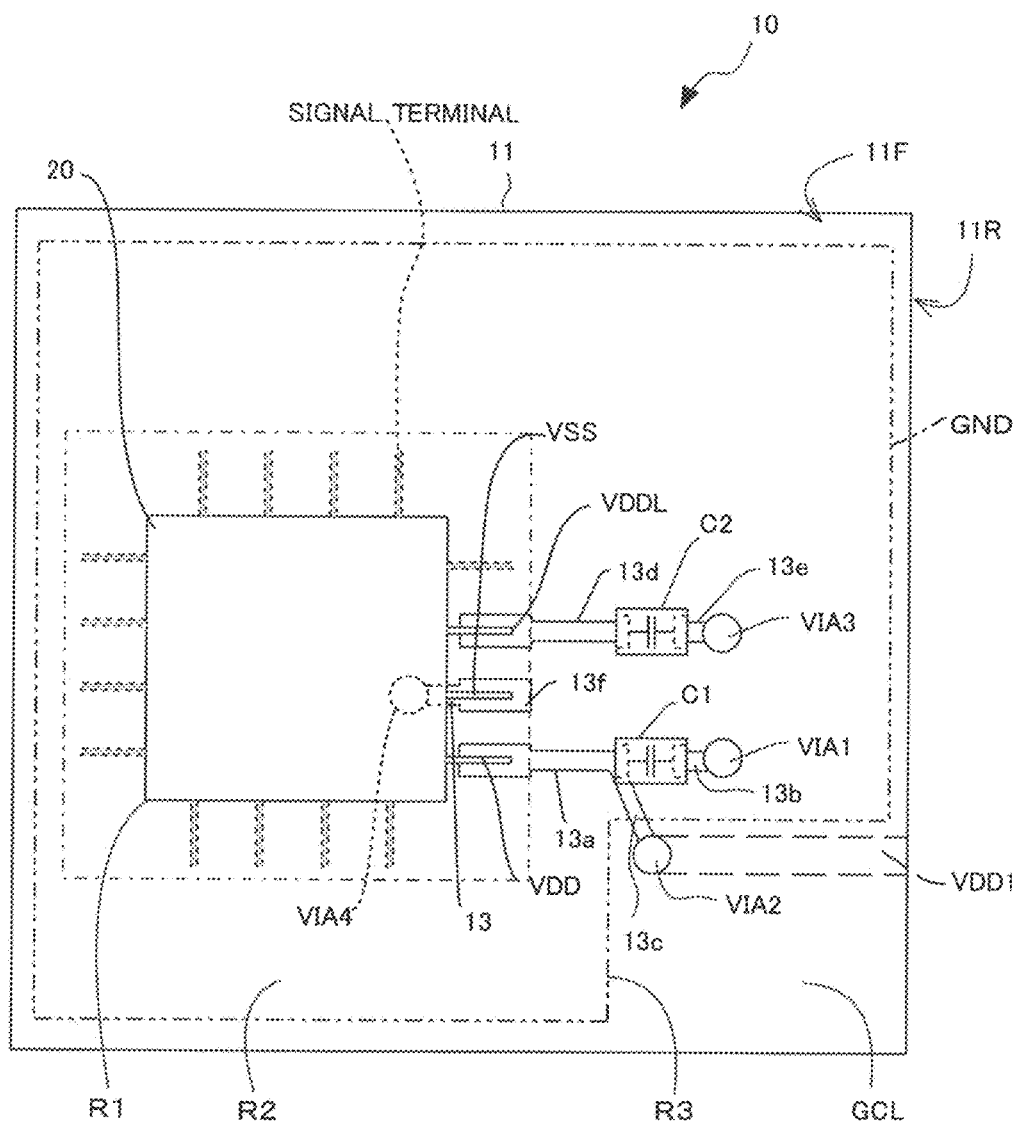
FIG. 1 is a schematic plan view illustrating part of a circuit board device according to a first embodiment.

Circuit board devices according to embodiments of the present invention will now be described below in detail with reference to the drawings. In those Examples, components having substantially the same function and configuration will be denoted by the same reference numerals, and redundant description will be omitted.

(FIRST EMBODIMENT)

FIG. 1 is a schematic plan view illustrating part of a circuit board device 10 of the present embodiment. A circuit board device 10 comprises a printed wiring board 11 on which an IC chip 20 is 11 provided. Further, the printed wiring board 11 of the circuit board device 10 includes printed wirings such as signal wiring patterns or the printed wiring patterns for signal wirings, although power supplying lines and ground lines are omitted for the sake of convenience in the description in FIG. 1. Still further, a description will be made with reference to a case where the printed wiring board 11 is a single-layer board which has an obverse surface on which an IC chip is provided and a reverse surface on which a ground layer GND is provided.

The IC chip 20 has a first power supply terminal VDD, a second power supply terminal VDDL, and a third power supply terminal VSS . The first power supply terminal VDD and the second power supply terminal VDDL are a plus power supply terminal of an FET circuit in the IC chip 20 and a drain-side power supply terminal of an N-channel FET, respectively. The third power supply terminal VSS is a minus power supply terminal of an FET circuit in the IC chip 20. The third power supply terminal VSS is also a ground terminal in the case of the one-side (single) power supply system and functions also as a source-side terminal of an N-channel FET. The IC chip 20 also includes a plurality of connection terminals such as signal terminals (indicated by broken lines) . Then, in this embodiment, a case where the IC chip 20 is packaged with a Quad Flat Package (QFP) type will be described. However, the packaging type of the IC chip may be have a shape having external connection terminals two-dimensionally arranged in an array, such as Ball Grid Array (BGA) ICs and Pin Grid Array (PGA) ICs . Further this embodiment may be have a configuration in that a power supply potential is provided to the first power supply terminal VDD, and an internal power supply potential generated in the IC chip 20 is provided to the second power supply terminal VDDL.

The printed wiring board 11 is configured as a single-layer board having a primary mono-layer (hereinafter referred to simply as a primary layer) having an obverse surface 11F and a reverse surface 11R. On the obverse surface 11F, there are defined a first region R1 and a second region R2 adjacent to each other. The IC chip 20 is provided with in the first region R1. Further, the first region R1 is a region on which the IC chip 20 is mounted. The second region R2 is a region in which terminals of the IC chip 20 are connected to the printed wiring board 11. On the reverse surface 11R, there are defined a ground region R3 and a cutout region GCL adjacent to each other, and the ground layer GND is formed on the ground region R3. The cutout region GCL is a region in which a power supplying line VDD1 is formed.

The obverse surface 11F of the printed wiring board 11 is provided with the IC chip 20 in the first region R1 . Further, in the second region R2, there are provided wiring patterns 13a, 13b, 13c, 13d and 13e (hereinafter referred to simply as conductors 13a, 13b, 13c, 13d and 13e respectively). Furthermore the bypass capacitor C1 and the bypass capacitor C2 are provided in the second region R2. One pad of the conductor 13a on one end side thereof is connected to one end of the first power supply terminal VDD of the IC chip 20, and the other pad of the conductor 13a on the other end side thereof is connected to one end of a bypass capacitor C1 on the power supply terminal side. One pad of the conductor 13b on one end side thereof is connected to one end of the bypass capacitor C1 on the ground terminal side, and the other end of the conductor 13b is connected to a via VIA1. One pad of the conductor 13d on one end side thereof is connected to one end of the second power supply terminal VDDL of the IC chip 20, and the other pad of the conductor 13d on the other end side thereof is connected to one end of a bypass capacitor C2 on the power supply terminal side. One pad of the conductor 13e on one end side thereof is connected to one end of the bypass capacitor C2 on the ground terminal side, and the other end of the conductor 13e is connected to a via VIA3. The via VIA3 passes through the primary layer of the printed wiring board 11 is connected to the ground layer GND on the reverse surface 11R. One end of the conductor 13c is connected to both ends of the bypass capacitor C1 on the power supply side and the conductor 13a, and the other end of the conductor 13c is connected to a via VIA2. The via VIA2 passes through the primary layer of the printed wiring board 11 is connected to the power supplying line VDD1 on the reverse surface 11R.

Further, the obverse surface 11F of the printed wiring board 11 is provided with a conductor 13f (first wiring) to cross a boundary between the first region R1 and the second region R2. One pad of the conductor 13f is connected to the third power supply terminal VSS of the IC chip 20 on the second region R2. The other end of the conductor 13f is connected to a via VIA4 on the first region R1. The via VIA4 passes through the primary layer of the printed wiring board 11 to be connected to the ground layer GND on the reverse surface 11R. In addition, the conductor 13f on the second region R2 is disposed between the conductor 13a (second wiring) and the conductor 13d (third wiring) apart from one another. These conductors 13a, 13f and 13d are arranged, in this order, on the second region R2 located on the outer periphery of the first region R1 without placing any other patterns therebetween.

On the reverse surface 11R on the opposite side of the obverse surface 11F of the printed wiring board 11, the ground region R3 is provided with the ground layer GND, and the cutout region GCL adjacent to the ground region R3 is provided with the power supplying line VDD1. The ground region R3 is provided as a wide area except the cutout region GCL on the reverse surface 11R. The ground region R3 is, for example, a rectangular region and has a shape in which one corner part is recessed inward. In this case, the cutout region GCL is this recessed region. In other words, the ground region R3 is provided avoiding the vicinity of the one corner of the reverse surface 11R, and the reverse surface 11R is provided with a notch area GCL including the one corner portion. In addition, the cutout region GCL is an area occupying a part of the reverse surface 11R including the outer periphery of the reverse surface 11R. An area excluding this portion, the cutout region GCL, may be the ground region R3.

The ground layer GND is a conductive layer uniformly provided in the ground region R3 on the reverse surface 11R. The ground layer GND is formed, for example, as a wiring larger than the pattern of the signal wiring, so-called uniform (i.e. solid) wiring. In the cutout region GCL of the reverse surface 11R, the power potential line VDD1 is formed apart from the ground layer GND.

Since the first embodiment of the present invention has such a structure, the via VIA 4 exists in the first region R1 in the obverse surface 11F of the printed wiring board 11. Therefore it is possible to prevent invasion of noise such as electromagnetic waves from the obverse surface 11F side.

The ground layer GND disposed on the reverse surface 11R of the printed wiring board provides ground potential to the third power supply terminal VSS of the IC chip 20, i.e., the ground terminal, through the via VIA4, which is a ground via. In addition, the vias VIA1 and VIA3, which are ground vias, also provide a ground potential to the ground side of the bypass capacitors C1 and C2. Moreover, since a ground wiring pattern of the conductor 13f, extending from the ground via VIA4, is disposed below the IC chip 20 on the obverse surface 11F side of the printed wiring board 11 to the third power supply terminal VSS of the ground terminal, the conductor 13f is also present in the first region R1 where the IC chip 20 is mounted. Therefore this arrangement can prevent the entering of noise, such as electromagnetic waves, from the obverse surface 11F side. By providing the power relevant line VDD 1 on the reverse surface 11R, the power supply line plays the role of an antenna for receiving electromagnetic waves when it is provided on the obverse surface 11F side. Therefore, although such as fluctuations in the power supply voltage, however, such a negative influence can be avoided by providing a power supply line in another layer.

(SECOND EMBODIMENT)

Figure 2:
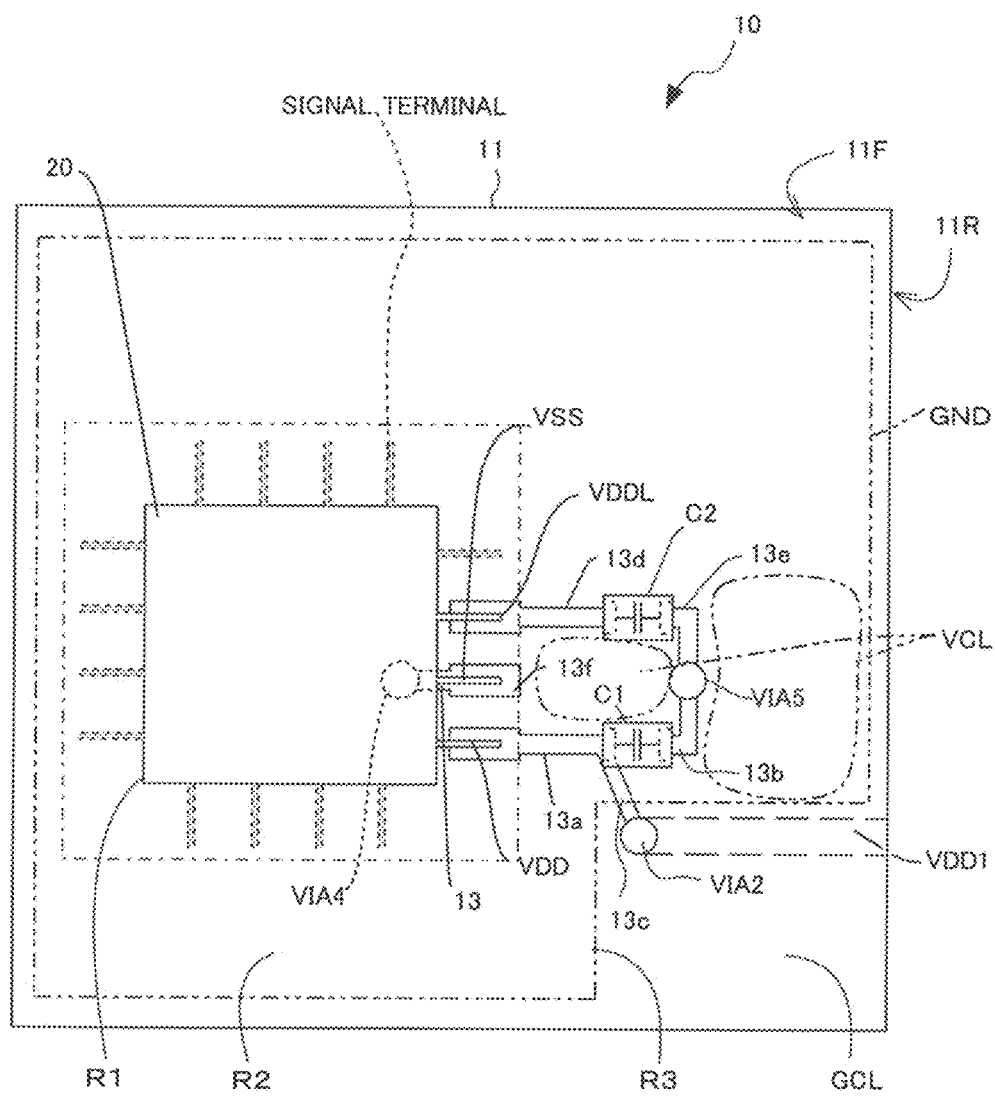
FIG. 2 is a schematic plan view illustrating part of a circuit board device according to a second embodiment.

FIG. 2 is a schematic plan view illustrating part of a circuit board device 10 according to a second embodiment.

Figure 3:
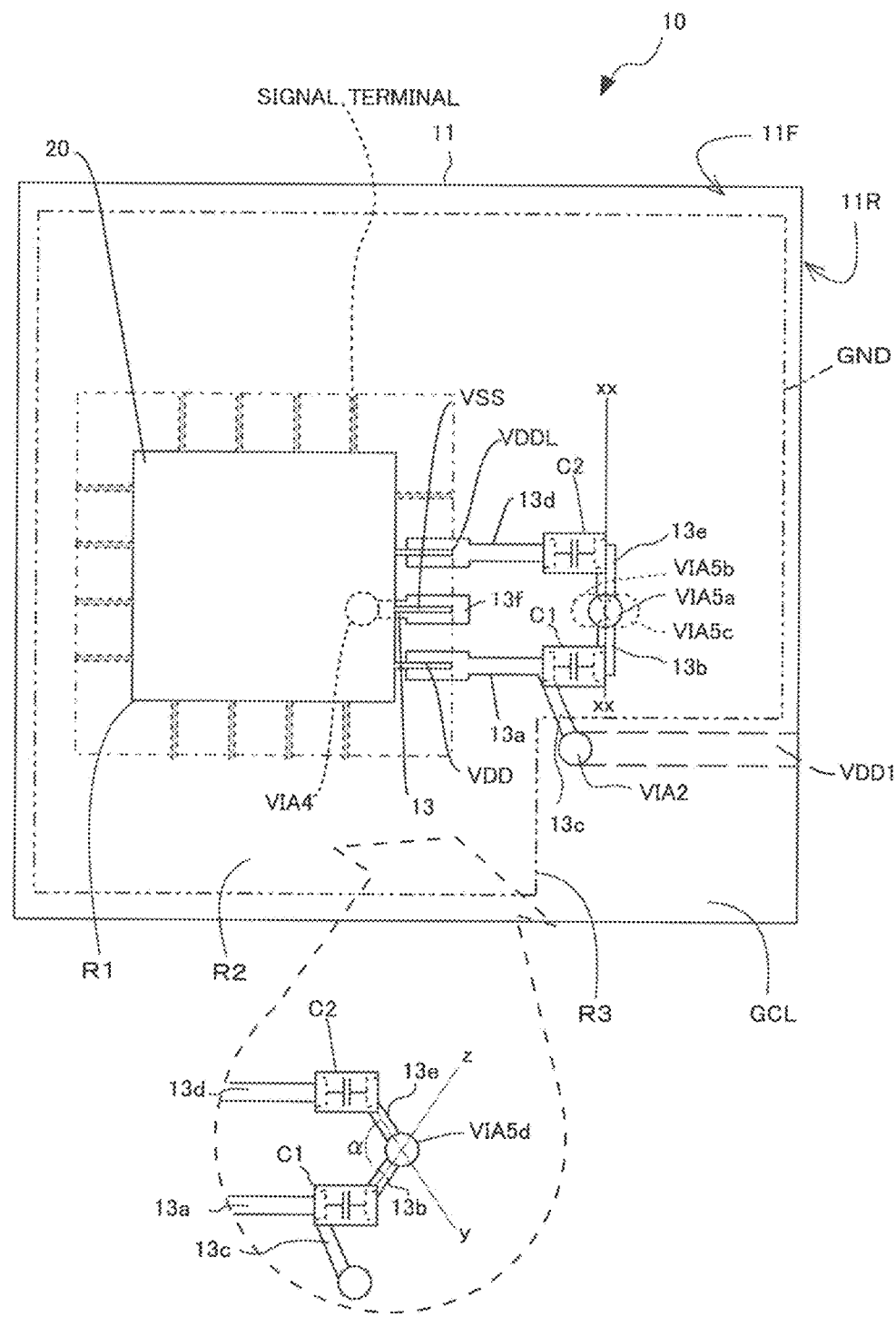
FIG. 3 is a schematic plan view illustrating a partially-modified example of the circuit board device of the second embodiment.

As shown in FIG. 2, the second embodiment has the same configuration as the first embodiment except that conductors 13b and 13e on the ground side of the bypass capacitors C1 and C2 are connected to a single common ground via VIA5 (which passes through a printed wiring board 11 to be connected to a ground layer GND on a reverse surface 11R) instead of the ground vias VIA1 and VIA3 of the first embodiment shown in FIG. 1. More specifically, the ground via VIA5 is disposed at a position intersecting with a straight line (not shown) connecting between one ends of the pair of bypass capacitors C1 and C2 on the ground side, and the conductors 13b and 13e are disposed while being connected to the common ground via VIA5. Among the ground via VIA5, and the conductors 13b and 13e, the ground via VIA5 is extended to a position farthest from the IC chip 20, and the conductors 13b and 13e are disposed closer to the IC chip 20 than the ground via VIA5 is. These ground via VIA5 and conductors 13b and 13e together form a ground line loop. Alternatively, as shown in FIG. 3, for example, the conductors 13b and 13e may be formed in such a manner that the other ends Ex of the pair of bypass capacitors C1 and C2 in the IC chip 20 are connected to a common ground via VIA5a and the ground via VIA5a intersects with or is in contact with (ground via VIA5b or VIA5c) a straight line xx-xx connecting to the other ends (ground side) Ex of the pair of bypass capacitors C1 and C2. In this manner, a ground line loop can be formed. Furthermore, as shown in a dashed arrow in FIG. 3, the wiring conductors 13b and 13e and a common ground via VIA5d may be configured in such a manner that an angle α is made by two planes y and z including a central axis J of the ground via VIA5d and the other ends Ex of the bypass capacitors C1 and C2 respectively so as to face the IC chip 20 with a predetermined angle of 90 degrees or more and 180 degrees or less, for example. Here, the conductors 13b and 13e may be connected to the bypass capacitors C1 and C2 in a curvilinear manner with the angle α, which is made by the conductors 13b and 13e and the ground via VIA5, having the aforementioned predetermined angle.

Also in the present embodiment, no third power supply terminal VSS of the IC chip 20 is connected to the ground via VIA5 with the ground line provided on the obverse surface 11F of the printed wiring board 11. This can prevent the entering of noise from such unconnected portion similarly to the first embodiment. In addition, since the via VIA4 exists in the first region R 1 in the obverse surface 11F of the printed wiring board 11, it is possible to prevent intrusion of electromagnetic waves or the like from the obverse surface 11F side. Moreover, since a ground wiring pattern of the conductor 13f, extending from the ground via VIA4, is disposed below the IC chip 20 on the obverse surface 11F side of the printed wiring board 11 to the third power supply terminal VSS of the ground terminal, the conductor 13f is also present in the first region R1 where the IC chip 20 is mounted. Therefore this arrangement can prevent the entering of noise, such as electromagnetic waves, from the obverse surface 11F side.

Furthermore, the wiring conductors on a surface layer of the third power supply terminal VSS are made independently, i.e., no connection is made between the conductors 13b and 13e and other wiring conductors except that the conductors 13b and 13e are used to connect the bypass capacitors C1 and C2 and the ground via VIA5 . Consequently, even if a ground line (not shown) is present, the entering of noise from such a ground line can be prevented from occurring.

As shown in FIG. 2, the printed wiring board 11 may be configured to have wiring absent regions VCLs provided so as to separate the common ground via VIA5 from conductors such as the signal lines and the ground line and interpose the bypass capacitors C1 and C2 and the via VIA5 therebetween.

(MAGNETIC FIELD NOISE IRRADIATION TEST)

Specifically, a magnetic field noise irradiation test was conducted on printed wiring boards with a noise simulator in order to confirm the effects of the wiring absent regions VCLs. In the magnetic field noise irradiation test, an apparatus for generating high-voltage impulse noise is employed, a loop antenna is connected to the apparatus to generate a magnetic field, and the magnetic field is irradiated onto a printed board. Resistance against such an impulse noise voltage is then measured.

Figure 4:
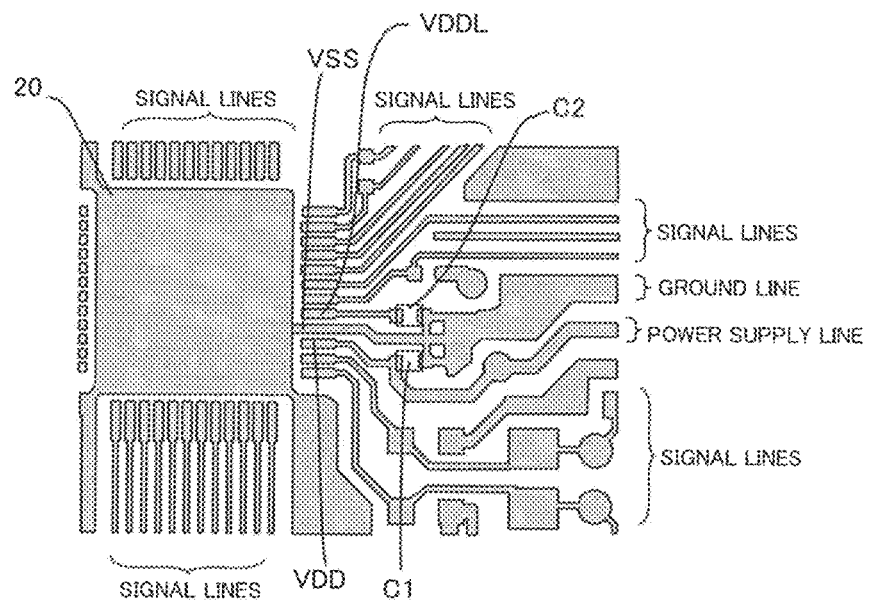
FIG. 4 is a plan view illustrating a part of a printed board according to a Comparative Example for the second embodiment.
Figure 5:
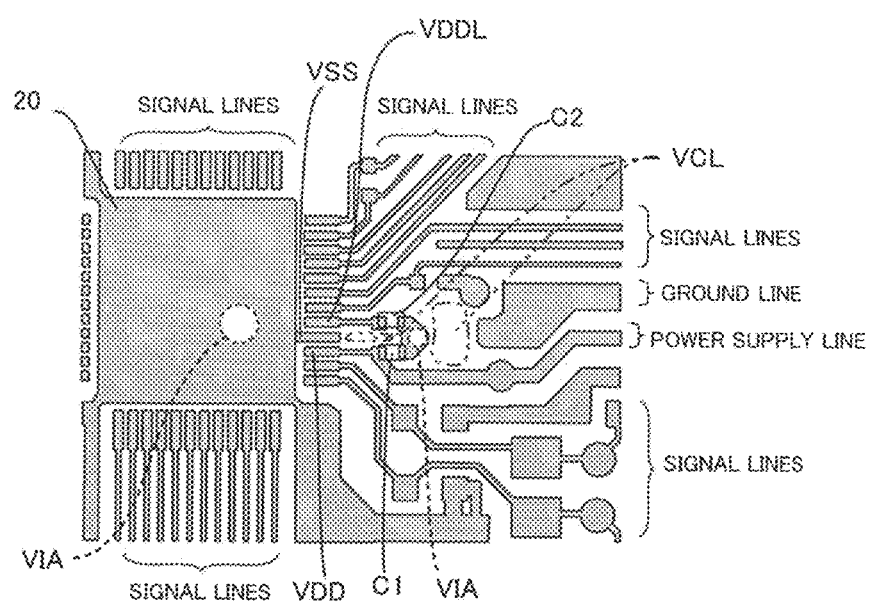
FIG. 5 is a plan view illustrating a part of the printed wiring board in the second embodiment.

FIG. 4 is a plan view illustrating part of a printed wiring board having no wiring absent regions VCLs (Comparative Example). FIG. 5 is a plan view illustrating part of a printed wiring board having the wiring absent regions VCLs. In addition, FIG. 6 is a schematic diagram of the printed wiring board extracting the main part from the partial plan view of the printed wiring board of FIG. 5.

The results of the magnetic field noise irradiation test showed that the conventional printed wiring board having no wiring absent regions VCLs, which is shown in FIG. 4, has a withstanding voltage of about 800 V but the printed wiring board having the wiring absent regions VCLs, which is shown in FIG. 5, has a withstanding voltage of 2000 V or more.

Figure 6:
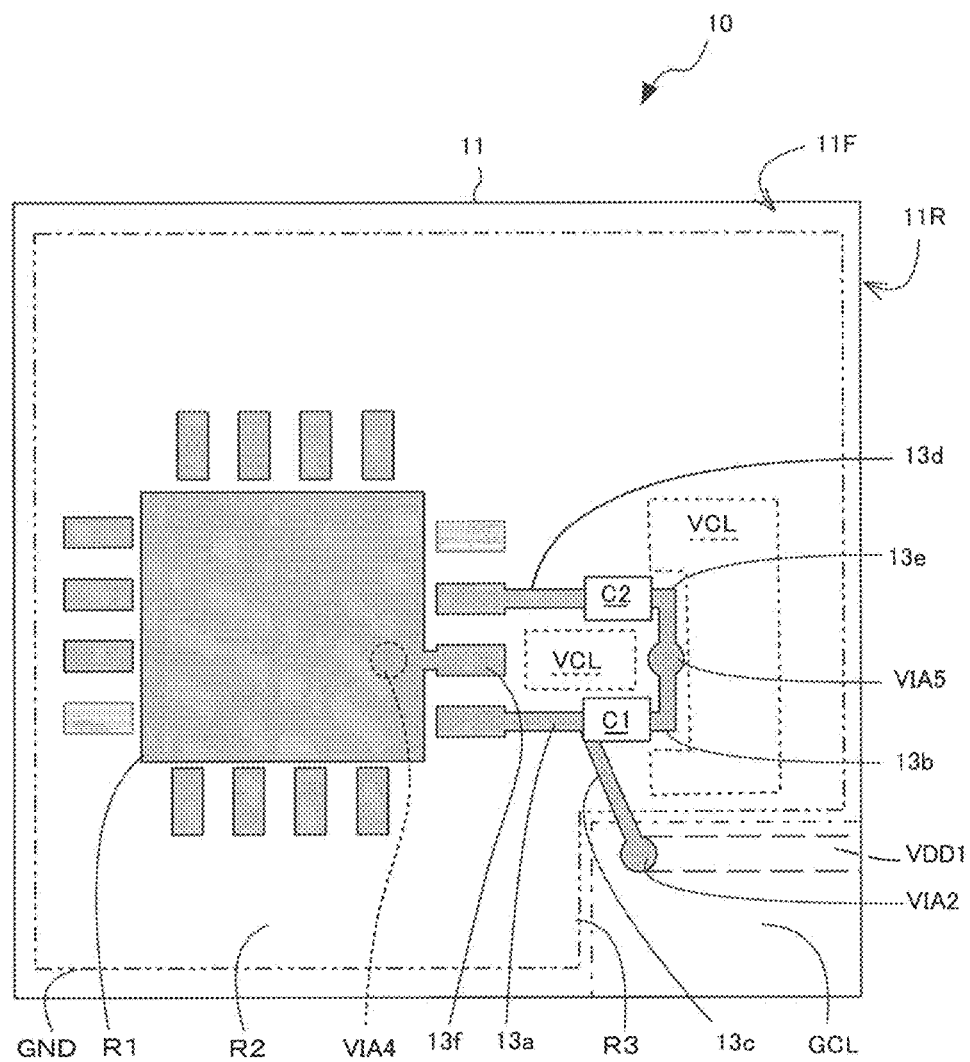
FIG. 6 is a schematic plan view illustrating a part of the printed wiring board of the circuit board device in the second embodiment.

Referring to FIG. 6, one of the wiring absent region VCL is surrounded by the conductor 13a connected to the first power supply terminal VDD, the bypass capacitor C1, the conductor 13b, VIA5, the conductor 13e, the bypass capacitor C2, the conductor 13d connected to the second power supply terminal VDDL and the conductor 13f connected to the third power supply terminal VSS. Therefore the one of the wiring absent region VCL exists at a position that interferes with the connection between the third power supply terminal VSS and both the first power supply terminal VDD and the second power supply terminal VDDL on the obverse surface 11F of the printed wiring board 11. The other of the wiring absent region VCL exists at a position that interferes with the connection relationship that the VIA5 connected to the ground layer GND, the conductor 13b and the conductor 13e are connected to other wires on the obverse surface 11F of the printed wiring board 11. Further, as shown in FIG. 6, the conductor 13f covers the first region R1 partially and is connected to the VIA 4.

According to the present embodiment, the wiring absent regions VCLs are disposed so as to surround part of the power supply-ground loop of the bypass capacitors connected to the power supply terminals of the IC chip. This can separate the power supply-ground loop from the outer periphery of an opening formed by the wiring absent region VCL, thus suppressing the influence of externally-received noise. Consequently, the influence of the externally-received noise can be reduced.

[MODIFIED EXAMPLE OF EMBODIMENT 2]

Figure 7:
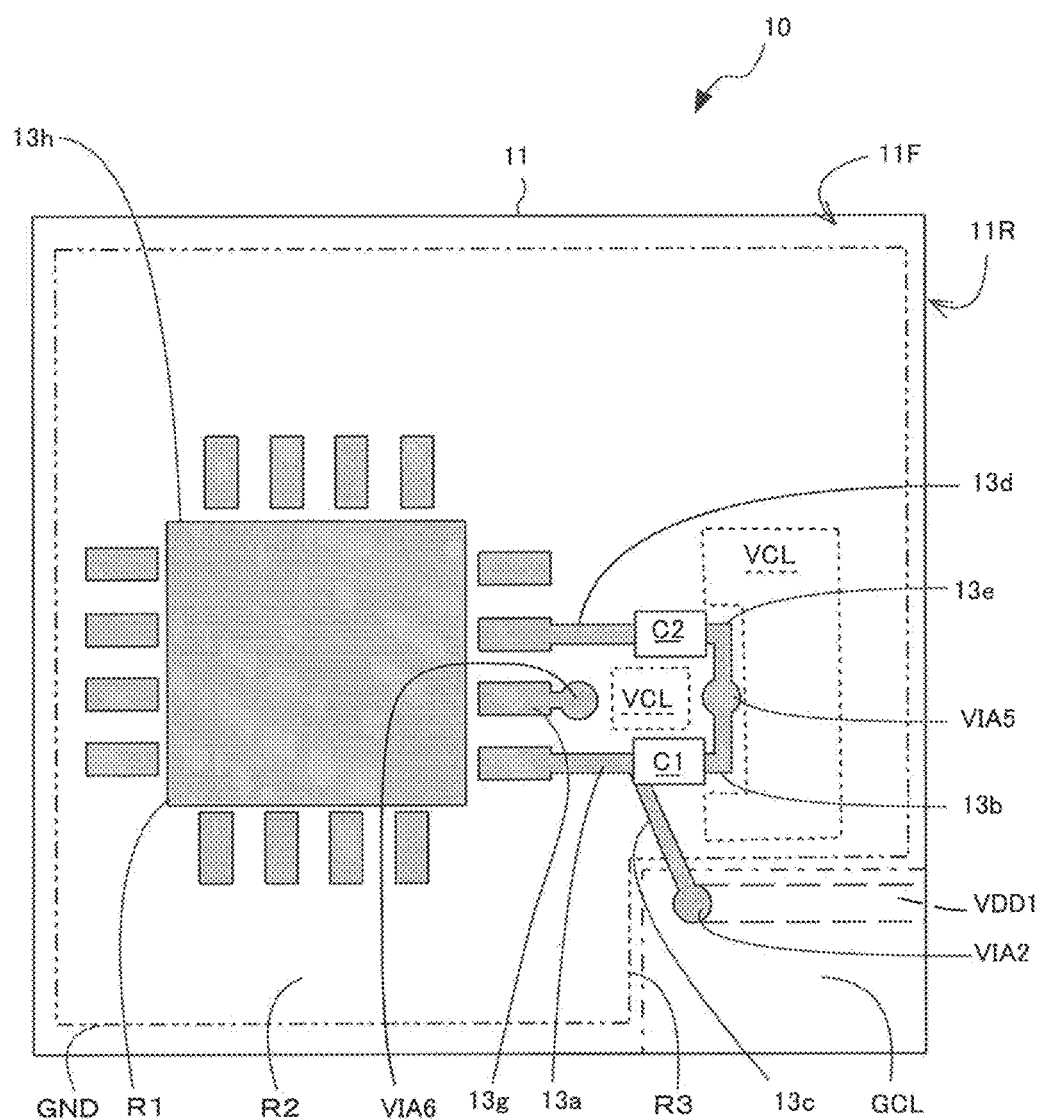
FIG. 7 is a schematic plan view illustrating a part of the printed wiring board of another partially-modified example of the circuit board device in the second embodiment.

FIG. 7 is a schematic plan view showing a part of the circuit board device 10 as a modified example of the second embodiment. In the modified example of the second embodiment, the conductor 13f, the conductor 13h and the ground via VIA6 is provided in place of the conductor 13f and the ground via VIA4 shown in FIG. 6 of the second embodiment. The conductor 13g is provided in the second region R2 of the obverse surface 11F of the printed wiring board 11. The third power supply terminal VSS of the IC chip 20 is connected to the pad on one end of the conductor 13g on the second region R2. The other end of the conductor 13g is connected to the ground via VIA6 on the second region R2. The conductor 13h is a wiring pattern of a so-called uniform (i.e. solid) wiring of GND potential formed over the first region R1 of the obverse surface 11F of the printed wiring board 11. The conductor 13h may be configured to extend from the corner of the first region R1 to the second region R2 widely avoiding other wiring patterns as shown in FIG. 5. The ground via VIA6 penetrates the second region R2 of the primary layer of the printed wiring board 11 and is connected to the ground layer GND of the reverse surface 11R. Unlike the conductor 13f shown in FIG. 6, the conductor 13g is provided apart from the conductor 13h covering the first region R1.

With such a configuration, the modified example has a configuration in which the conductor 13b and the conductor 13e are surrounded by the absent regions as in the second embodiment. As a result, even if there is a ground line (not shown) different from the ground line used for the IC chip 20 on the obverse surface 11F side, noise intrusion from the ground line pattern can be prevented. The power supply ground loop is separated from the outer periphery of the opening formed by the absent region VCL, and the influence of noise received from the outside can be suppressed. As a result, the influence of noise received from the outside can be reduced. In addition, by separating the conductor 13g from the conductor 13h as in the present modification, there is reduced possibilities that an electromotive is induced electromotive current is generated along the contour of the conductor 13h of the uniform (i.e. solid) wiring (particularly when it has an extended part to the second region R2 as mentioned above), and/or noise may be given via other wiring patterns.

According to the circuit board devices of the above-described embodiments, a large part of the ground line loop from the power supply terminal, which is making a turn, is provided on a surface different from the obverse surface of the circuit board device (in the cross section of the printed wiring board) . This can reduce the occurrence of electromotive current due to the electromagnetic induction. Thus, as compared to a case where the bypass capacitors are simply mounted on the obverse surface of the circuit board device, electromotive current due to external electromagnetic waves (noise) can be reduced, thus preventing the false operation of an LSI or an IC. In addition, with these configurations, the ground line loop is expanded to connect to the first power supply terminal VDD or the second power supply terminal VDDL and the third power supply terminal VSS of the IC chip 20 to the reverse surface 11R side without forming a loop connected directly from the power supply to ground at the obverse surface 11F of the printed wiring board 11. Therefore, even if an electromagnetic wave is applied from the side of the obverse surface 11F, a structure in which an electromotive induced electromotive force is hardly generated is generated, so that erroneous operation due to noise can be suppressed. An electromagnetic wave was applied from the vertical direction he first power supply terminal Loop connected to the ground via VIA 5 from the VDD via the bypass capacitor C1 and the loop connected to the ground via VIA 5 from the second power supply terminal VDDL via the bypass capacitor C2. In addition, since the first power supply terminal VDD (i.e. the second wiring), the third power supply terminal VSS (i.e. the first wiring) and the second power supply terminal VDDL (i.e. the third wiring) are arranged in this order, when electromagnetic waves are applied from the vertical direction to both one loop connected from the first power supply terminal VDD via the bypass capacitor C1 to the ground via VIA 5 and the other loop connected from the second power supply terminal VDDL via the bypass capacitor C2 to the ground via VIA 5, as seen from the third power supply terminal VSS, the electromotive current of each loop flows in the opposite direction to cancel each other. Therefore, the induced current applied to the first power supply terminal VDD, the second power supply terminal VDDL and the third power supply terminal VSS is reduced, and as a result, the noise itself due to the electromotive current can be reduced. Moreover, in addition to the bypass capacitors, the same applies also to booster capacitors in switching regulators and phase compensating capacitors in linear regulators. Furthermore, the present invention is useful also when wiring conductors configured to make a loop among a plurality of terminals of an LSI are required in a crystal oscillator or a filter, for example.

Although an end of each via is provided with a connection pad and the via is connected to a bypass capacitor through the connection pad and the wiring conductor in the above-described embodiments, the present invention is not limited thereto. For example, vias may be directly connected to various surface-mounted components such as connection terminals or bypass capacitors.

Further, in the printed wiring board embodiment above mentioned, it is described as the printed wiring board of a single layer, but in reality it is not limited to this and the printed wiring board having a plurality of wiring substrates maybe used. In such a case, the reverse surface 11R may be formed on the back side of the layer to which the IC chip is provided and also it may be formed on the other surface of the layer opposite to the obverse surface 11F side. It is sufficient if the reverse surface 11R is formed on any side of the opposite side of the obverse surface 11F.

This application claims the benefit of foreign priority to Japanese Patent Application No. 2018-027561, filed Feb. 20, 2018, which is incorporated by reference in its entirety.

What is claimed is:
1. A printed wiring board comprising:
a primary layer which has a first region on which an IC chip is mounted and a second region adjacent to the first region;
a first wiring which is provided across the first region and the second region of the primary layer of the printed wiring board;
a second wiring which is provided in the second region of the primary layer of the printed wiring board;
a first via which passes through the primary layer of the printed wiring board to be connected to the first wiring of the first region;
a second via which passes through the primary layer of the printed wiring board to be connected to the second wiring; and
a ground layer which is provided on an opposite side of the first wiring and the second wiring with respect to the primary layer and is electrically connected to the first wiring and the second wiring through the first via and the second via.
2. The printed wiring board according to claim 1, further comprising a third wiring is provided in the second region of the printed wiring board and is connected to the second via.
3. The printed wiring board according to claim 2, the second circuit and the first circuit and the third transistor are located on an outer periphery of the first region and arranged in this order on the second region.
4. The printed wiring board according to claim 2, wherein the primary layer of the printed wiring board has a first wiring absence region surrounded by the first wiring and the second via and the third wiring and the second wiring.
5. The printed wiring board according to claim 2, wherein the primary layer of the printed wiring board has a second wiring absence region where the first wiring and the third wiring are independent of other wiring patterns formed on the an obverse surface.
6. A printed wiring board comprising:
a primary layer which has a first region on which an IC chip is mounted and a second region adjacent to the first region;
a first wiring which is provided 1in the second region of the primary layer of the printed wiring board;
a second wiring which is provided in the second region of the primary layer and is placed at a distance from the first wiring and is supplied with a power supply potential;
a third wiring which is provided in the second region of the primary layer and is placed at a distance from the first wiring and the second wiring;
a first via which passes through the primary layer to be connected to the first wiring;
a second via which passes through the primary layer of the printed wiring board to be connected to the second wiring and the third wiring; and
a ground layer which is provided on an opposite side of the first wiring, the second wiring and the third wiring with respect to the primary layer and is electrically connected to the first wiring, the second wiring and the third wiring through the first via and the second via.
7. The printed wiring board according to claim 6, the second circuit and the first circuit and the third transistor are located on an outer periphery of the first region and arranged in this order on the second region.
8. The printed wiring board according to claim 6, wherein the primary layer of the printed wiring board has a first wiring absence region surrounded by the first wiring and the second via and the third wiring and the second wiring.

9. The printed wiring board according to claim 6, wherein the primary layer of the printed wiring board has a second wiring absence region where the first wiring and the third wiring are independent of other wiring patterns formed on the an obverse surface.

10. A circuit board device comprising:
a printed wiring board including
a primary layer which has a first region on which an IC chip is mounted and a second region adjacent to the first region;
a first wiring which is provided across the first region and the second region of the primary layer of the printed wiring board;
a second wiring which is provided in the second region of the primary layer of the printed wiring board;
a first via which passes through the primary layer of the printed wiring board to be connected to the first wiring of the first region;
a second via which passes through the primary layer of the printed wiring board to be connected to the second wiring; and
a ground layer which is provided on an opposite side of the first wiring and the second wiring with respect to the primary layer and is electrically connected to the first wiring and the second wiring through the first via and the second via; and
an IC chip which is mounted on the first region of the printed wiring board and has a ground terminal connected to the first wiring and a power supply terminal connected to the second wiring.

11. The circuit board device according to claim 10, further comprising a third wiring is provided in the second region of the printed wiring board and is connected to the second via.

12. The circuit board device according to claim 11, the second circuit and the first circuit and the third transistor are located on an outer periphery of the first region and arranged in this order on the second region.

13. The circuit board device according to claim 11, wherein the primary layer of the printed wiring board has a first wiring absence region surrounded by the first wiring and the second via and the third wiring and the second wiring.

14. The circuit board device according to claim 11, wherein the primary layer of the printed wiring board has a second wiring absence region where the first wiring and the third wiring are independent of other wiring patterns formed on the an obverse surface.

15. A circuit board device comprising:
a printed wiring board including
a primary layer which has a first region on which an IC chip is mounted and a second region adjacent to the first region;
a first wiring which is provided 1in the second region of the primary layer of the printed wiring board;
a second wiring which is provided in the second region of the primary layer and is placed at a distance from the first wiring and is supplied with a power supply potential;
a third wiring which is provided in the second region of the primary layer and is placed at a distance from the first wiring and the second wiring;
a first via which passes through the primary layer to be connected to the first wiring;
a second via which passes through the primary layer of the printed wiring board to be connected to the second wiring and the third wiring; and
a ground layer which is provided on an opposite side of the first wiring, the second wiring and the third wiring with respect to the primary layer and is electrically connected to the first wiring, the second wiring and the third wiring through the first via and the second via; and
an IC chip which is mounted on the first region of the printed wiring board and has a ground terminal connected to the first wiring and a power supply terminal connected to the second wiring.

16. The circuit board device according to claim 15, the second circuit and the first circuit and the third transistor are located on an outer periphery of the first region and arranged in this order on the second region.

17. The circuit board device according to claim 15, wherein the primary layer of the printed wiring board has a first wiring absence region surrounded by the first wiring and the second via and the third wiring and the second wiring.

18. The circuit board device according to claim 15, wherein the primary layer of the printed wiring board has a second wiring absence region where the first wiring and the third wiring are independent of other wiring patterns formed on the an obverse surface.

* * * * *